United States Patent [19]

Shimohara

[11] Patent Number: 5,298,871
[45] Date of Patent: Mar. 29, 1994

[54] PULSE WIDTH MODULATION SIGNAL GENERATING CIRCUIT

[75] Inventor: Kazunari Shimohara, Tokyo, Japan

[73] Assignee: NEC Corporation, Tokyo, Japan

[21] Appl. No.: 996,900

[22] Filed: Dec. 28, 1992

[30] Foreign Application Priority Data

Dec. 25, 1991 [JP] Japan .................. 3-343410

[51] Int. Cl.⁵ .................. H03K 7/08; H02P 6/02
[52] U.S. Cl. .................. 332/109; 318/599; 318/684; 318/811
[58] Field of Search .................. 332/109, 110, 111; 318/599, 684, 811

[56] References Cited

U.S. PATENT DOCUMENTS 4,105,939 8/1978 Culbertson .................. 318/599
5,013,985 5/1991 Itoh et al. .................. 318/599

Primary Examiner—Siegfried H. Grimm
Attorney, Agent, or Firm—Whitham & Marhoefer

[57] ABSTRACT

A microcomputer having a signal generating circuit which generates pulse width modulation signals defined by a carrier wave, and which controls controlled portions according to pulse width modulating signals. The signal generating circuit comprises a carrier wave defining timer which outputs a value varying the same as a waveform providing a carrier wave, a control register which controls the time period of the timer, a reload register which holds a count value, control blocks which generate pulse width modulation signals according to the value of the timer and the count value of the reload register.

3 Claims, 6 Drawing Sheets

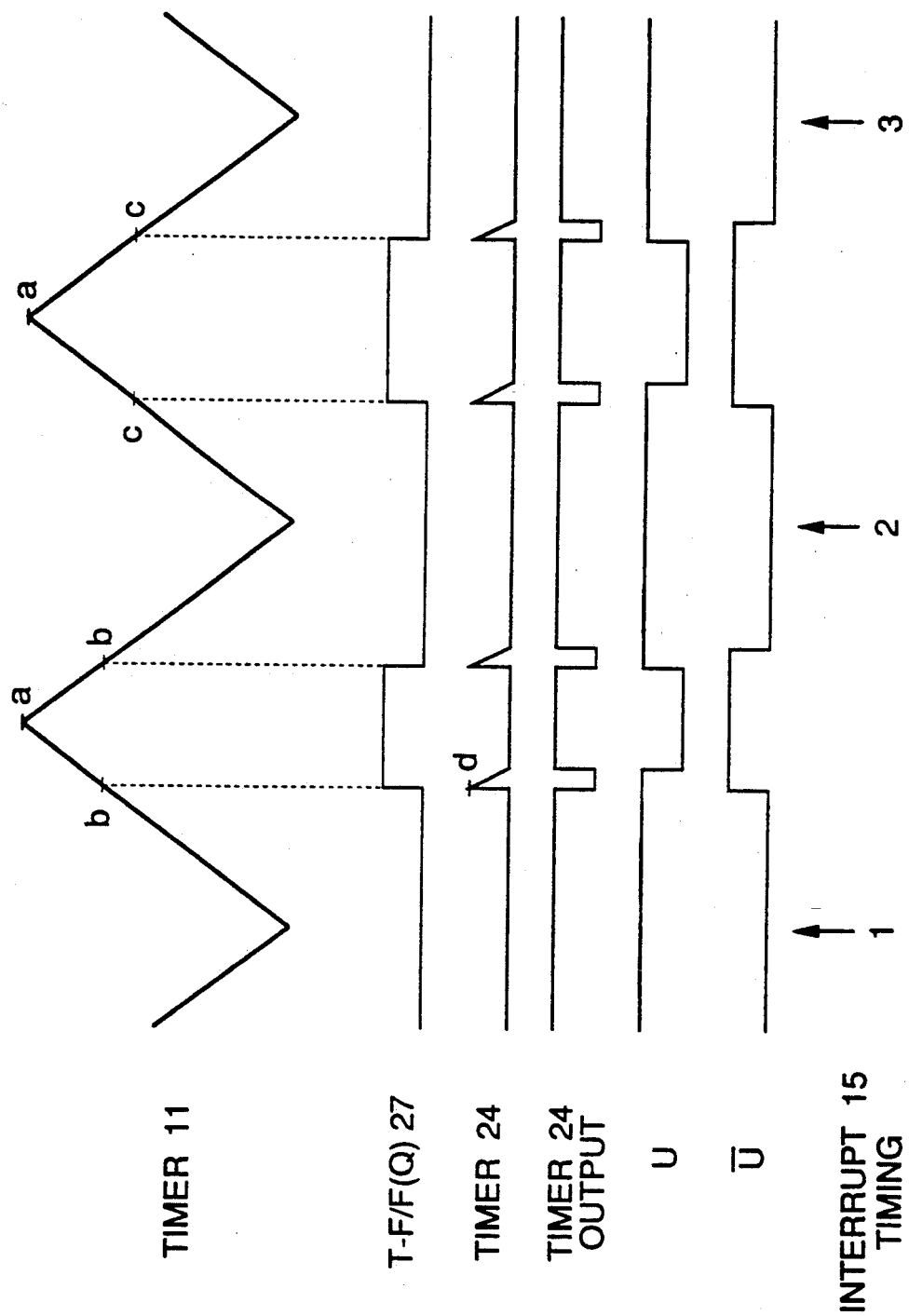

PULSE WIDTH MODULATION SIGNAL GENERATING CIRCUIT

BACKGROUND OF THE INVENTION

1. Field of the Invention

This invention relates to microcomputers. More specifically, this invention relates to a PWM (pulse width modulation) signal generating circuitry which drives a unit to be controlled such as an inverting device.

2. Related Art

Conventionally, when a three-phase motor is driven by using an inverting device, the inverting device is controlled by a PWM signal. In general, a PWM control is a method for controlling the inverting devices by using a fundamental wave of a pulse period known as a carrier wave and changing a duty (active level) of the fundamental wave. And, it is well known that the inverting device includes two transistors which are connected in series between a power supply and a ground (GND), and the two transistors are cyclicly turned on and off in a complementary relation. In practice, however, because of a delay of a gate input signal and a variation of on-off characteristics of the transistors, it is in some cases that both of the two transistors are turned on at the same time so that an excessive current flows. The excessive current may break the transistors.

In general, to avoid such problems, it has been an ordinary practice that the gate input signals of the inventing devices have a period for ensuring that both transistors turn off. That period is called a dead time.

Now, a construction and an operation of the prior microcomputer generating PWM signals will be briefly described with reference to FIGS. 1 and 2.

FIG. 1 is a block diagram of the construction of the prior microcomputer. The prior microcomputer includes a timer 101 and a compare register 102. The timer 101 is used as a counter of a period of the carrier wave and a counter of a set-reset timing of the PWM waveform. The compare register 102 is a register which sets the time period of the carrier wave (carrier frequency). The compare register 102 compares the value of the timer 101 with a comparison value set in the compare register itself, and generates a periodical interrupt signal 103 when a coincidence is detected.

The microcomputer also has three control blocks 110, 120 and 130 which have the same construction. The control block 110 consists of four compare registers 111, 112, 113 and 114, and two set-reset flipflops (RS-F/F) 115 and 116.

It is well known that a three-phase motor has three phases which are called U-phase, V-phase and W-phase, respectively. In case of driving these three-phases by using the inventing devices, the microcomputer outputs control signals U and $\overline{U}$ for the U-phase, control signals V and $\overline{V}$ for the V-phase and control signals W and $\overline{W}$ for the W-phase. In the figures, the three-phase motor can be controlled by controlling the U-phase by using the control block 110, controlling the V-phase by using the control block 120 and controlling the W-phase by using the control block 130.

Now, the operation of the microcomputer shown in FIG. 1 will be described with reference to FIG. 2 illustrating a timing diagram.

The timer 101 performs a freerunning-counter action. The compare register 102 connected to the timer 110 compares the value of the timer 101 with the set comparison value. In this comparison action, the compare register 102 has set a value "a" as a comparison value at first stage. In case of the value of the timer 101 coinciding the value "a", the compare register 102 detects the coincidence of both values and generates the interrupt signal 103. The following process will be practiced by a software process at the time of the input of the interrupt signal 103. And the interrupt signal 103 sets up the value "b" which provides a time period width of the next period to the compare register 102 as a comparison value.

A value "c1" is set to the compare register 114, and a value "d1" is set to the compare register 111 respectively. In case of a coincidence of the value of timer 101 with the value "c1" or the value "d1", the control signal U will be set and the control signal $\overline{U}$ will be reset.

If the compare register 111 detects a coincidence of the value of the timer 101 and the value "d1", the interrupt signal 117 will be generated. In response to the interrupt signal 117, the compare register 114 will be set with the value "c2", and the compare register 111 will be set with the value "d2" by a software process, in order to determine the timing used in the next PWM time period.

And, a value "e1" is set to the compare register 112, and a value "f1" is set to the compare register 113 respectively. In case of a coincidence of the value of timer 101 with the value "e1" or the value "f1", the control signal U will be set and the control signal $\overline{U}$ will be reset. If the compare register 113 detects a coincidence of the value of the timer 101 and the value "f1", the interrupt signal 118 will be generated. In Response to the interrupt signal 118, the compare register 112 will be set with the value "e2", and the compare register 113 will be set with the value "f2" by a software process, in order to determine the timing used in the next PWM time period.

The prior microcomputer generates the PWM signal under the above-mentioned respective processes. The U-phase operation has been described in this example, however the operations of the V-phase and the W-phase are the same as the U-phase operation.

That is, the V-phase signal sets a comparison value to respective compare registers by the interrupt signals 127 and 128, and the W-phase signal sets comparison values to respective compare registers by the interrupt signals 137 and 138.

As above mentioned, the prior art microcomputer sets up the various set values such as the time period of the carrier wave, the timing of the set-reset of the PWM signal of each output, the dead time of the period of the active level (a low level in this case) of the control signals U and $\overline{U}$, the control signals V and $\overline{V}$, and the control signals W and $\overline{W}$ necessary for the drive of inverting devices. As shown in FIG. 1, the number of the compare registers setting the comparison values is 13 in the case of three-phase motor control.

And also, it will be seen that the number of the interrupts (the number of the interrupt signals) generated in one period of the PWM time period is 7, shown as the Reference Numbers 103, 117, 118, 127, 128, 137 and 138.

A problem of the microcomputer for driving the inverter controlled by the prior PWM control is an increase of the interruption number and therefor an increase of the necessary time for a software process. Because the set of the period of the time period of the carrier wave, the set of the timing of set and reset of the PWM signal including dead time are set up by an operation process of the software, interrupting the CPU as occasion arises. And such problems cause the microcomputer for driving the inverter controlled by the prior PWM control not to be able to control a high speed motor whose carrier wave frequency is 15~20 KHz.

SUMMARY OF THE INVENTION

Therefore, it is an object of the present invention to provide an improved microcomputer for driving inverters on the basis of the PWM control, which minimizes the number of interruptions and the necessary time for software processes.

Another object of the present invention is to provide an improved microcomputer for driving inverters on the basis of the PWM control, which can control a three-phase motor with a high speed.

According to the present invention there is provided a microcomputer which carries a signal generating circuit, which generates a number of pulse width modulating signals defined by a carrier wave, and which controls a unit to be controlled according to the pulse width modulating signals.

More specifically, there is provided a microcomputer having a signal generating circuit provided on a semiconductor substrate for generating pulse width modulation signals defined by a carrier wave, for the purpose of controlling a unit to be controlled in accordance with the pulse width modulation signals, the signal generating circuit comprising:

a carrier wave defining timer for outputting a value that varies the same as a waveform providing the carrier wave;

a control register for controlling a period of the carrier wave defining timer;

a reload register for holding a counting value;

control blocks each for generating the pulse width modulation signals on the basis of a value of the carrier wave defining timer and the count value held in the reload register;

each of the control blocks comprising;

a compare register for ceaselessly comparing the value of the carrier wave defining timer with a comparison value, and outputting a coincidence detecting signal in case of detecting a coincidence between a value of the carrier wave defining timer and the comparison value;

a logical circuit set and reset according to the coincidence detecting signal;

a transfer register for transferring the comparison value to the compare register at a predetermined timing;

a one-shot timer set with the count value held in the reload register in synchronism with the set-reset of the logical circuit;

means for generating the pulse width modulation signal according to an output signal of the one-shot timer and an output signal of the logical circuit.

According to a first aspect of the microcomputer of the present invention, the carrier wave is a sawtooth modulated carrier wave, and the carrier wave defining timer is an up-timer for outputting a value varying the same as a sawtooth wave defining the carrier wave, and wherein the logical circuit is a reset-set flipflop.

According to a second aspect of the microcomputer of the present invention, the carrier wave is a chopping modulation carrier wave, the carrier wave defining timer is a down-timer for outputting a value varying the same as a chopping wave defining the carrier wave, and the logical circuit is a toggle flipflop.

BRIEF DESCRIPTION OF THE DRAWINGS

FIG. 6 is a timing diagram showing an operation of the microcomputer of FIG. 5.

DESCRIPTION OF PREFERRED EMBODIMENTS

Figure 1:
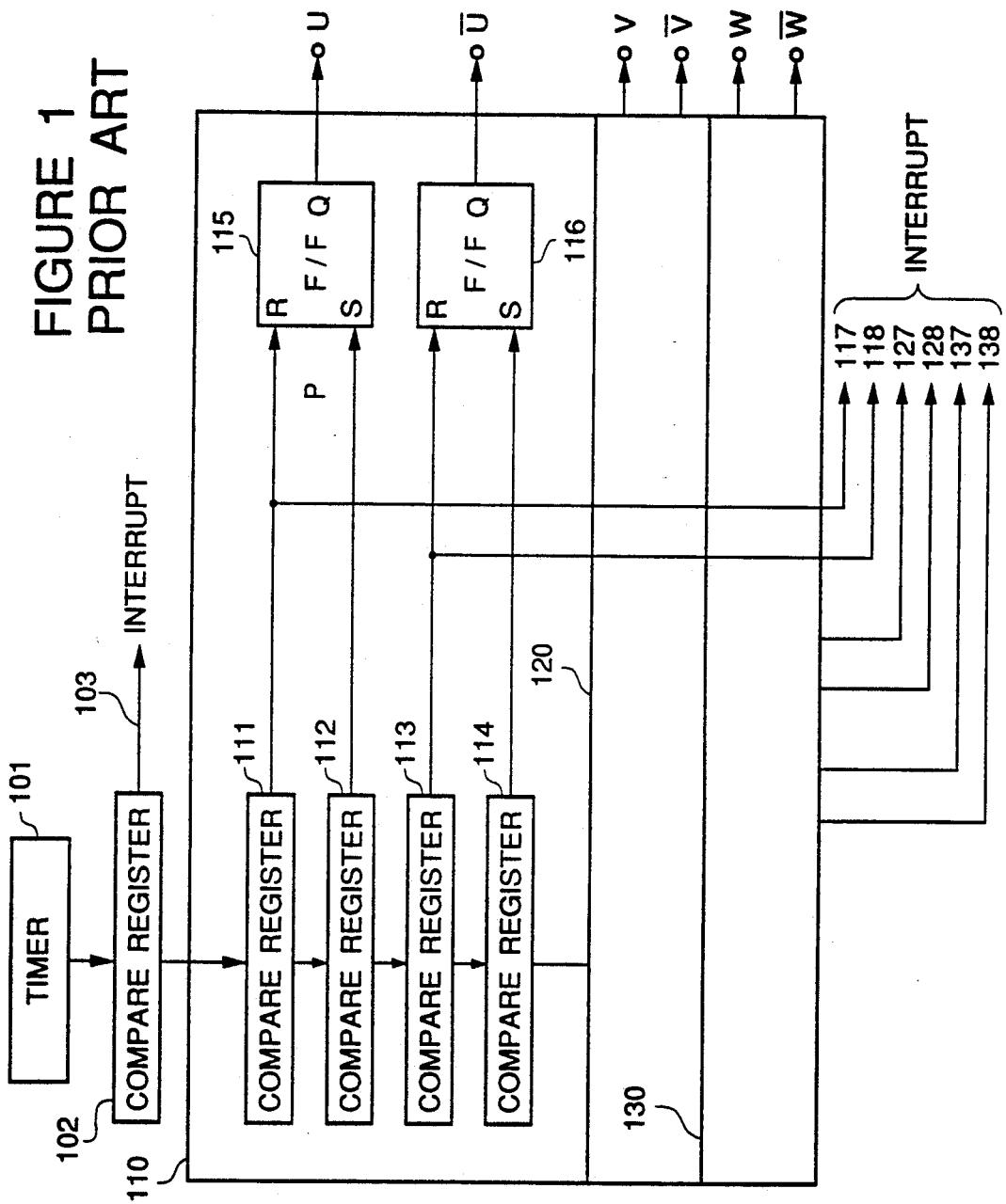
FIG. 1 is a block diagram showing a configuration of the prior microcomputer.
Figure 2:
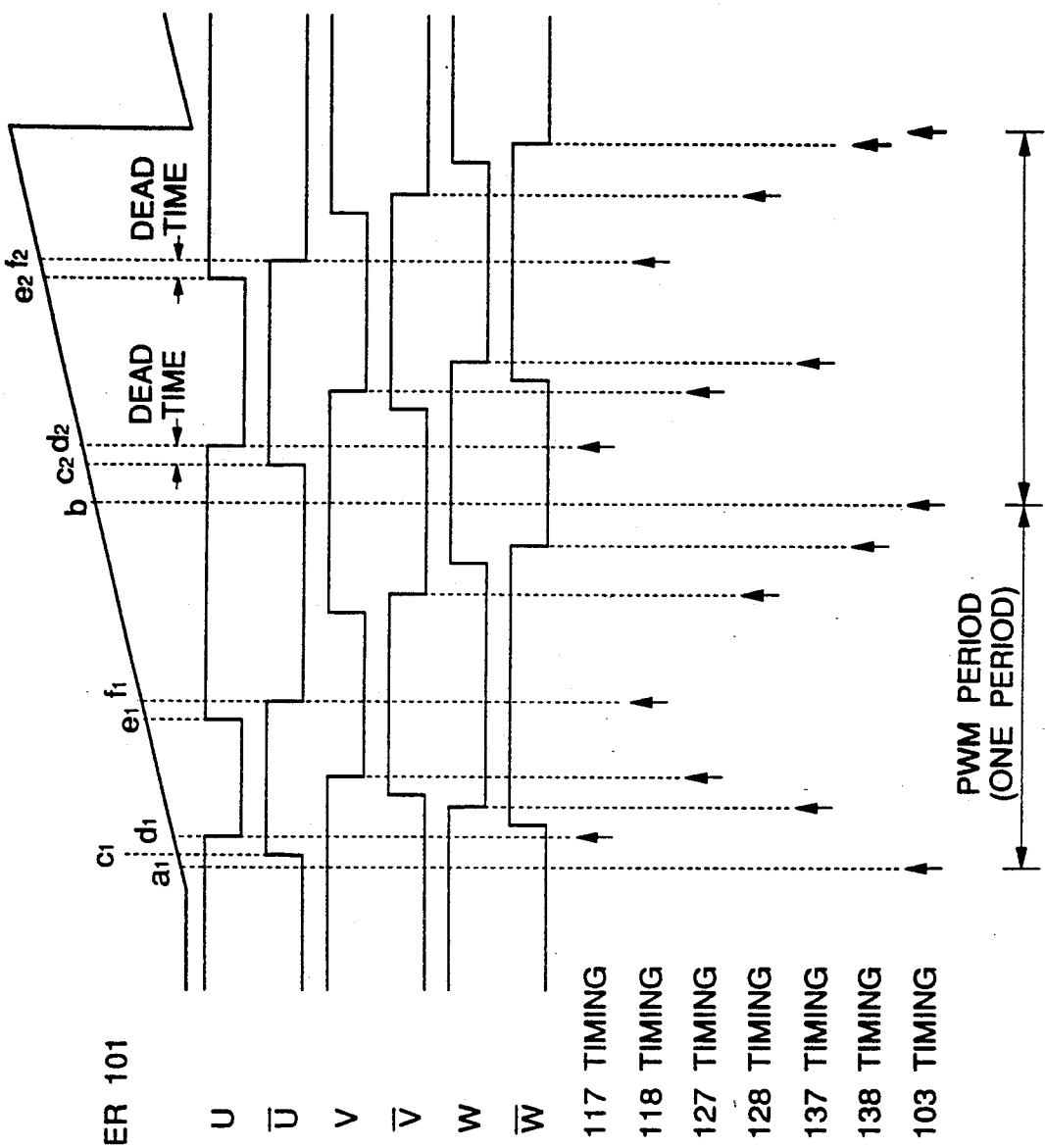
FIG. 2 is a timing diagram showing an operation of the microcomputer of FIG. 1.
Figure 3:
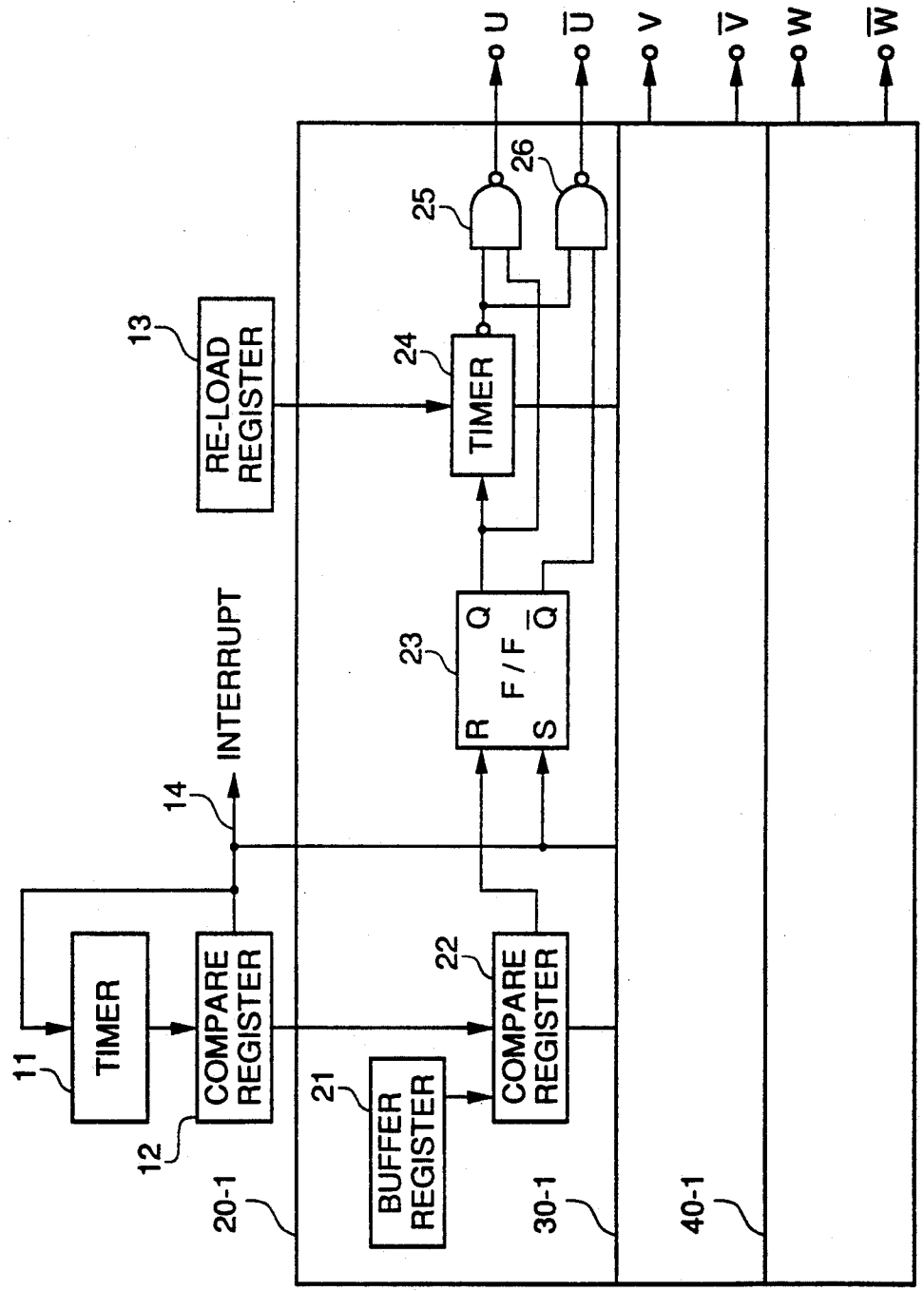
FIG. 3 is a block diagram showing a configuration of the microcomputer of the first embodiment of the present invention.

In FIG. 3, a microcomputer of the first embodiment of the present invention includes a timer 11 which outputs a value varying the same as a waveform providing a carrier wave, a compare register (control register) 12 which controls a time period of the timer 11, a reload register 13 which holds a count value of a dead time timer which will be described in detail later.

And also, the microcomputer includes a U-phase control block 20-1 controlling a U-phase of a three-phase motor, a V-phase control block 30-1 controlling a V-phase of the same motor, and a W-phase control block 40-1 controlling a W-phase of the same motor.

The U-phase control block 20-1 comprises a buffer register (transfer register) 21, a compare register 22, a RS-F/F 23 a deadtime timer 24, and two-input NAND gates 25, 26. The V-phase control block 30-1 and the W-phase control block 40-1 also have the same circuit configuration as the U-phase control block 20-1.

The first embodiment of the present invention has three differences in circuit configuration. First of the differences is that the timer 11 outputs a value which varies the same as the waveform providing a carrier wave. Second of the differences is that the timer 11 has a deadtime timer 24. And third of the differences is that the circuit generating a timing signal for a PWM control is a two-stage register comprising a buffer register 21 and a compare register 22.

Figure 4:
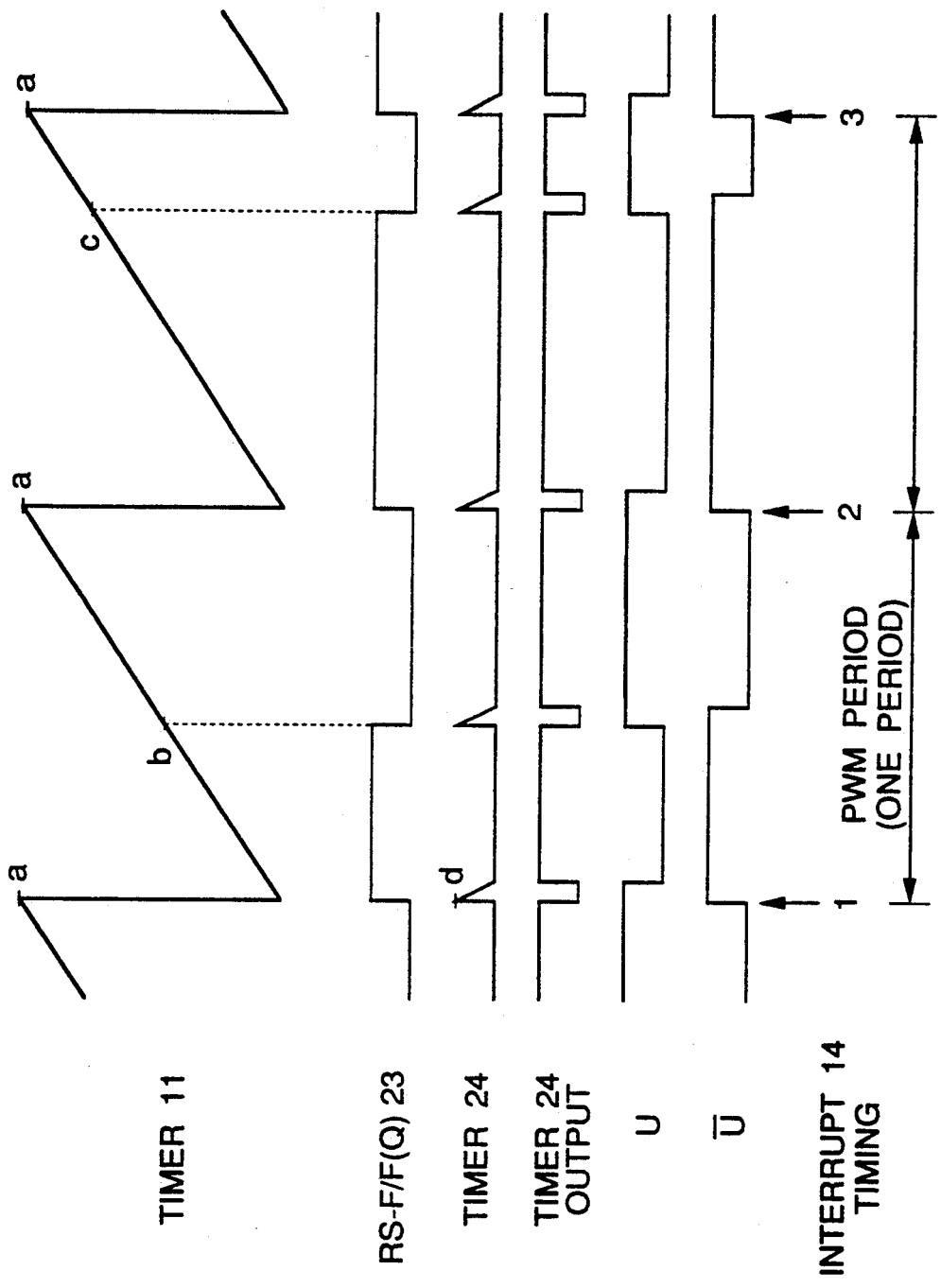
FIG. 4 is a timing diagram showing an operation of the microcomputer of FIG. 3.

Referring to FIG. 4, the microcomputer shown in FIG. 3 operates as follows.

A PWM modulation can be of two types from a carrier operation view point. One is a sawtooth wave modulation, and the other is a chopping wave modulation. In this embodiment of the present invention, the sawtooth wave modulation is used. And FIG. 4 shows a timing diagram of U-phase signal.

The timer 11 is an up timer the value of which varies the same as the sawtooth wave. And when the compare register 12 detects the coincidence of the value "a" set up in the compare register 12 with the value of the timer 11, the timer 11 will be cleared according to an interrupt signal 14 output from the compare register 12. The timer 11 produces an interval timer operation as above mentioned.

The free running timer of the prior art has a problem that even if the period of the next time period is same as before, the period of the next time period must be set up using the software process. On the other hand the construction of the embodiment of the present invention has no need to rewrite the comparison value set up in the compare register 12 in case of a constant time period. Therefore a load caused by the software process is reduced.

When the interrupt signal 14 (which is shown at timing 1) is generated, RS-F/F 23 is set up and the value "b" of the buffer register 21 set within the former time period is transferred to the compare register 22 as a comparison value, then the value "c" provided the PWM timing of following time period is set up to the buffer register 21 by the software process.

The timer 11 continues to up count. Then, when the timer 11 counts the value "b", the compare register 22 detects the coincidence of the value, the RS-F/F 23 is reset according to the coincidence detecting signal. After that, the timer 11 continues to up count. Then, when the timer 11 counts the value "a", the compare register 12 detects the coincidence of the value and the timer 11 is cleared.

At this time, the interrupt signal 14 (which is shown at timing 2) is generated, RS-F/F 23 is set up and the value "c" of the buffer register 21 is transferred to the compare register 22 as a comparison value, then a next value provided the PWM timing of following time period is set up to the buffer register 21 by the software process.

The repeat of the above-mentioned operation generated the PWM signal.

As mentioned before, the value set at one former period can be used at the present period by the generating circuit of the PWM, timing being composed by the buffer register 21 and the compare register 22. Therefore, a value of the PWM timing can be set up within the one former period, and there is an enough margin to operate a software process.

The operation of the timer 24 is described as follows. Referring to FIG. 4 the timer 24 operates as a deadtime timer.

At first stage, the deadtime value (the value "d") is held in a reload register 13, when the set-reset timing of the RS-F/F 23 (Q output) is triggered, the value "d2" held in the reload register 13 is set up to the timer 24, then the timer 24 starts the down-counting. That is, the timer 24 operates as a function of one-shot downtimer, and out puts a low-level signal only during the counting period.

The two-input NAND gate 25 inputs an output of the timer 24 and a Q output of the RS-F/F 23, and outputs a waveform of U-terminal shown in FIG. 4.

The two-input NAND gate 26 inputs an output of the timer 24 and a $\overline{Q}$ output of the RS-F/F 23, and outputs a waveform of $\overline{U}$-terminal shown in FIG. 4.

Therefore, the deadtime timer 24 automatically outputs a waveform having a deadtime which does not have an overlapping period of an active level (low level) of a signal.

The process of the U-phase was illustrated before, and each process of the U-phase and the W-phase operates the same.

The above-mentioned construction of this present invention has the advantage that the necessary number of set up registers is only one for one-phase (three registers for three-phase) and the generating number of the interruption (interrupt signal 14) is one within one period of a carrier frequency.

Therefore, there is an advantage of reduced software load compared with the prior construction of the microcomputer.

And the deadtime necessary for the driving of inverter devices is set up by means of the deadtime timer, so there is no necessity to set up the timing by a software process. Therefore, a high speed motor control of high efficiency can be constructed using inverter devices.

Figure 5:
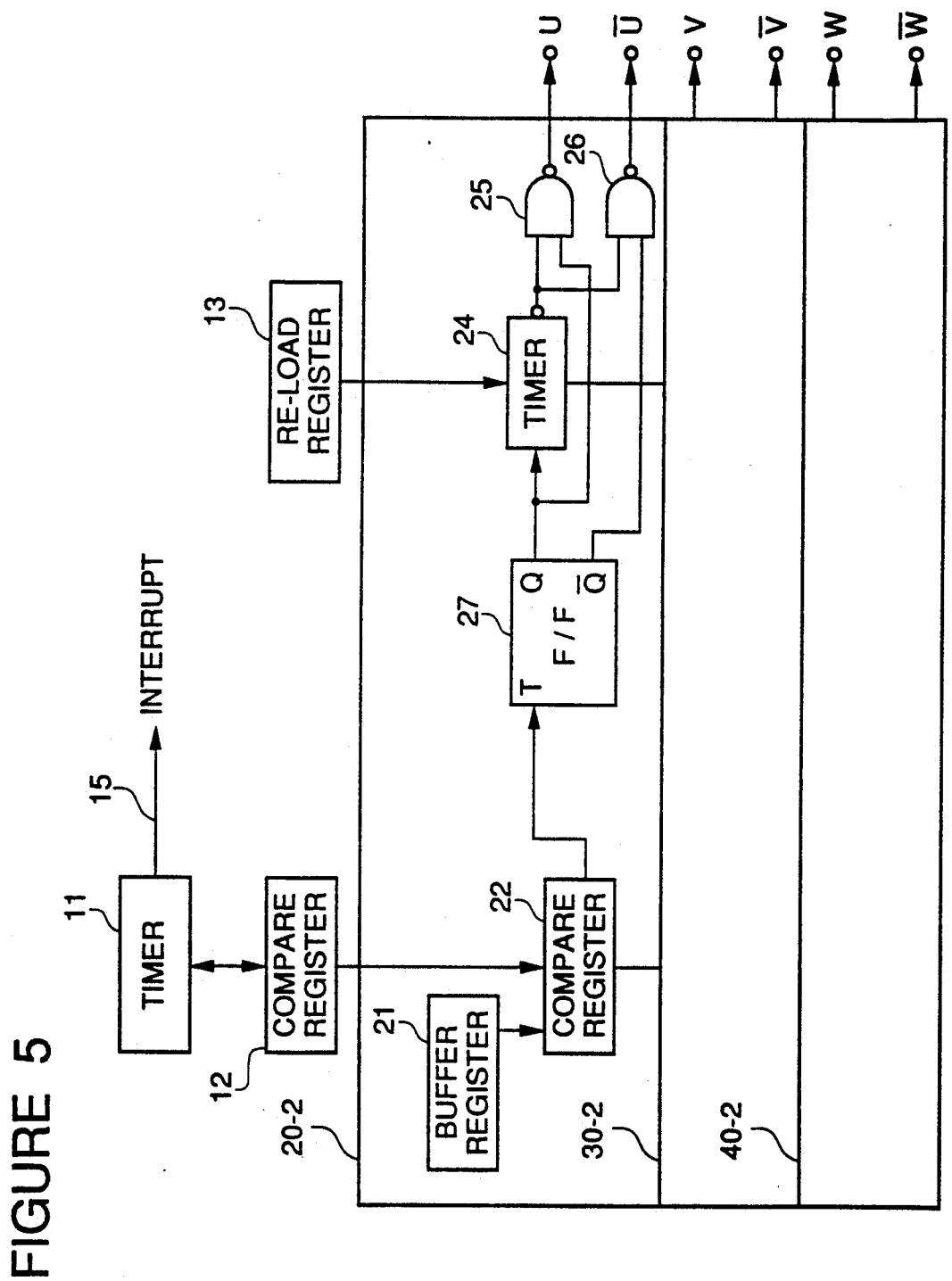
FIG. 5 is a block diagram showing a configuration of the microcomputer of the second embodiment of the present invention.

Referring to FIG. 5, the microcomputer of the second embodiment of this present invention has the same circuit construction as the first embodiment of this present invention shown in FIG. 3 except for the former mentioned two subjects. One is that the timer 11 operates as an up-down counter and the carrier wave is a chopping modulation wave. The other is that the toggle flipflop (T-F/F) 27 is used instead of RS-F/F 23. Therefore, as in a former-mentioned illustration, devices having the same function have the same reference number and the illustration of the devices is omitted.

Referring to FIG. 6, an operation of the microcomputer shown in FIG. 5 is illustrated.

An interrupt signal 15 is generated when the value of timer 11 is o". At the time of the interrupt timing 1, the value "b" of the buffer register 21 set in the former period is transferred to the compare register 22 as a comparison value. And, the software process sets the value "c" providing the PWM timing of next time period.

The timer 11 operates as an up-counter. When the value of that counting reaches the value "b", the compare register 22 detects the coincidence, and the T-F/F 27 is set by the coincidence detecting signal.

Afterwards, the timer 11 continues to up-count. When the timer 15 counts the value "a", the compare register 12 detects the coincidence and the timer 11 changes its function from up-counting to down-counting at the time of the coincidence detecting signal generating.

In the next stage, the timer 11 operates as a down counter. When the timer 11 counts the value "b", the compare register 22 detects the coincidence and the coincidence detecting signal resets the T-F/F 27. The timer 11 continues to down-count. When the timer 11 counts the value "o", the timer 11 generates an interrupt signal 15 (shown at the timing 2). According to the interrupt signal 15, the value "c" set in the buffer register 21 is transferred to the compare register as a comparison value by a software process, and the value providing the PWM timing of next time period is set up in the buffer register 21.

The repeat of the former operation generates the PWM signal. According to the chopping modulation of the prior art, a timing of set and reset of a flipflop is set up respectively.

On the other hand, according to the above-mentioned second embodiment of this present invention, the timings of set and reset are same so that their timings are symmetrical with regard to the peak of the chopping wave.

So, the PWM timing can be set up by an interrupt signal generated within one period. Therefore, the number of a register setting and of interruption are the same as in the first embodiment using a sawtooth wave. And an operation of a deadtime timer 24 and an output of U-terminal, $\overline{U}$-terminal are the same as in the first embodiment, so the illustration is omitted.

The invention has thus been shown and described with reference to the specific embodiments. However, it should be noted that the present invention is in no way limited to the details of the illustrated structures but changes and modifications may be made within the scope of the appended claims.

What is claimed is:

1. A microcomputer having a signal generating circuit provided on a semiconductor substrate for generating pulse width modulation signals defined by a carrier wave, for the purpose of controlling a unit to be controlled in accordance with the pulse width modulation signals, said signal generating circuit comprising:

a carrier wave defining timer for outputting a value that varies the same as a waveform providing said carrier wave;

a control register for controlling a period of said carrier wave defining timer;

a reload register for holding a counting value;

control blocks each for generating said pulse width modulation signals on the basis of a value of said carrier wave defining timer and said count value held in said reload register;

each of said control blocks comprising;

a compare register for ceaselessly comparing the value of said carrier wave defining timer with a comparison value, and outputting a coincidence detecting signal in case of detecting a coincidence between a value of said carrier wave defining timer and said comparison value;

a logical circuit set and reset according to said coincidence detecting signal;

a transfer register for transferring said comparison value to said compare register at a predetermined timing;

a one-shot timer set with said count value held in said reload register in synchronism with said set-reset of said logical circuit;

means for generating said pulse width modulation signal according to an output signal of said one-shot timer and an output signal of said logical circuit.

2. A microcomputer according to claim 1, wherein said carrier wave is a sawtooth modulated carrier wave, and said carrier wave defining timer is an up-timer for outputting a value varying the same as a sawtooth wave defining said carrier wave, and wherein said logical circuit is a reset-set flipflop.

3. A microcomputer according to claim 1, wherein said carrier wave is a chopping modulation carrier wave, said carrier wave defining timer is a down-timer for outputting a value varying the same as a chopping wave defining said carrier wave, and said logical circuit is a toggle flipflop.

* * * * *